(12) United States Patent
Hsu et al.

(10) Patent No.: US 10,177,011 B2
(45) Date of Patent: Jan. 8, 2019

(54) CHIP PACKAGING METHOD BY USING A TEMPORARY CARRIER FOR FLATTENING A MULTI-LAYER STRUCTURE

(71) Applicant: POWERTECH TECHNOLOGY INC., Hsinchu County (TW)

(72) Inventors: Hung-Hsin Hsu, Hsinchu County (TW); Nan-Chun Lin, Hsinchu County (TW); Shang-Yu Chang Chien, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/603,475

(22) Filed: May 24, 2017

(65) Prior Publication Data
US 2018/0301352 A1    Oct. 18, 2018

Related U.S. Application Data

(60) Provisional application No. 62/484,907, filed on Apr. 13, 2017.

(51) Int. Cl.
| | |
|---|---|
| *H01L 21/48* | (2006.01) |
| *H01L 21/683* | (2006.01) |
| *H01L 23/00* | (2006.01) |
| *H01L 21/56* | (2006.01) |
| *H01L 23/498* | (2006.01) |

(52) U.S. Cl.
CPC ...... *H01L 21/4857* (2013.01); *H01L 21/4853* (2013.01); *H01L 21/563* (2013.01); *H01L 21/568* (2013.01); *H01L 21/6835* (2013.01); *H01L 23/49816* (2013.01); *H01L 24/16* (2013.01); *H01L 24/81* (2013.01); *H01L 2221/68318* (2013.01); *H01L 2221/68345* (2013.01); *H01L 2221/68359* (2013.01); *H01L 2221/68368* (2013.01); *H01L 2224/16227* (2013.01); *H01L 2224/81005* (2013.01); *H01L 2224/81191* (2013.01)

(58) Field of Classification Search
CPC .................................................. H01L 21/4857
USPC .......................................................... 438/118
See application file for complete search history.

(56) References Cited

U.S. PATENT DOCUMENTS

| | | | | |
|---|---|---|---|---|
| 2004/0195686 | A1* | 10/2004 | Jobetto | H01L 21/568 257/734 |
| 2009/0218687 | A1* | 9/2009 | Chou | H01L 21/76801 257/737 |

(Continued)

*Primary Examiner* — Igwe U Anya
(74) *Attorney, Agent, or Firm* — Winston Hsu

(57) ABSTRACT

A chip packaging method includes forming a first redistribution layer and a first dielectric layer on a first temporary carrier to generate a plurality of first conductive interfaces close to the first temporary carrier, each pair of neighboring first conductive interfaces having a first pitch; forming a second dielectric layer on a first portion of the first redistribution layer and the first dielectric layer so as to cover the first portion of the first redistribution layer and expose a second portion; and forming a second redistribution layer and a third dielectric layer over the second dielectric layer to generate a plurality of second conductive interfaces. A circuitry being formed by at least the first redistribution layer and the second redistribution layer and each pair of neighboring second conductive interfaces has a second pitch larger than the first pitch.

13 Claims, 10 Drawing Sheets

(56) References Cited

U.S. PATENT DOCUMENTS

| | | | |
|---|---|---|---|
| 2012/0153445 A1* | 6/2012 | Son | H01L 23/3128 |
| | | | 257/668 |
| 2014/0070422 A1* | 3/2014 | Hsiao | H01L 24/24 |
| | | | 257/774 |
| 2014/0210099 A1* | 7/2014 | Hu | H01L 24/19 |
| | | | 257/774 |
| 2015/0011051 A1* | 1/2015 | Lin | H01L 21/4846 |
| | | | 438/107 |
| 2015/0130070 A1* | 5/2015 | Lin | H01L 23/481 |
| | | | 257/774 |
| 2017/0148763 A1* | 5/2017 | Woychik | H01L 25/0652 |
| 2018/0025992 A1* | 1/2018 | Hung | H01L 21/486 |
| | | | 257/668 |
| 2018/0226333 A1* | 8/2018 | Shih | H01L 23/49838 |

\* cited by examiner

CHIP PACKAGING METHOD BY USING A TEMPORARY CARRIER FOR FLATTENING A MULTI-LAYER STRUCTURE

CROSS REFERENCE TO RELATED APPLICATIONS

This application claims the benefit of U.S. Provisional Application No. 62/484,907, filed on Apr. 13, 2017, the contents of which are incorporated herein by reference.

BACKGROUND OF THE INVENTION

1. Field of the Invention

The present invention relates to a chip packaging method, and more particularly, a chip packaging method performing by using a temporary carrier for flattening a multi-layer structure.

2. Description of the Prior Art

In prior art, a multi-layer structure including a set of dielectric layers and a set of redistribution layers is formed from a bottom side, and a plurality of conductive interfaces with a larger pitch are formed on the bottom side. For example, FIG. 1 illustrates a part of a package structure 100 according to the prior art. In the package structure 100, a chip unit 110 is disposed on a multi-layer structure 120. The multi-layer structure 120 includes dielectric layers 120$p$1-120$p$2 and two metal layers 120$r$1 and 120$r$2. A circuitry is designed and formed by patterning the dielectric layers 120$p$1-120$p$2 and the metal layers 120$r$1 and 120$r$2. The chip unit 110 includes a chip 100$c$ and a set of solder bumps 1101-1104 for accessing the chip 100$c$.

As shown in FIG. 1, the metal layer 120$r$2 is patterned to form a plurality of conductive interfaces 1301-1304 with a smaller pitch, and the metal layer 120$r$1 is patterned to form a plurality of conductive interfaces 140 with a larger pitch. The metal layer 120$r$1 is formed before the metal layer 120$r$2. For a first built up layer on a carrier, there is no warpage concern.

Since the conductive interfaces 1301-1304 with the smaller pitch are used to connect to the chip unit 110, the conductive interfaces 1301-1304 are more critical than the conductive interfaces 140. However, if the metal layer 120$r$1 and the dielectric layer 120$p$1 are formed first, the conductive interfaces 1301-1304 formed afterwards will be undesirable. As shown in FIG. 1, the conductive interfaces 1301 and 1304 are higher than the conductive interfaces 1302-1303 since the distribution of the dielectric layers 120$p$1-120$p$2 and the metal layers 120$r$1-120$r$2 makes the upper surface of the dielectric layer 120$p$2 uneven. As shown in FIG. 1, the variation of heights of the conductive interfaces 1301 to 1304 makes the conductive interfaces 1302, 1303 unable to make contact with their corresponding solder bumps 1102, 1103 when trying to dispose the chip unit 110 onto the multi-layer structure 120, reducing the yield of the package structure 100.

SUMMARY OF THE INVENTION

An embodiment of the present invention provides a chip packaging method. The chip packaging method includes forming a first redistribution layer and a first dielectric layer on a first temporary carrier to generate a plurality of first conductive interfaces upon the first temporary carrier, each pair of neighboring first conductive interfaces having a first pitch; forming a second dielectric layer on a first portion of the first redistribution layer and the first dielectric layer so as to cover the first portion of the first redistribution layer and expose a second portion of the first redistribution layer; and forming a second redistribution layer and a third dielectric layer over the second dielectric layer to generate a plurality of second conductive interfaces, a circuitry being formed by at least the first redistribution layer and the second redistribution layer and each pair of neighboring second conductive interfaces having a second pitch larger than the first pitch.

These and other objectives of the present invention will no doubt become obvious to those of ordinary skill in the art after reading the following detailed description of the preferred embodiment that is illustrated in the various figures and drawings.

DETAILED DESCRIPTION

FIGS. 2-7 illustrate the process of forming a package structure 20 according to an embodiment of the present invention. The package structure 20 may be seen in FIG. 7.

Figure 1:
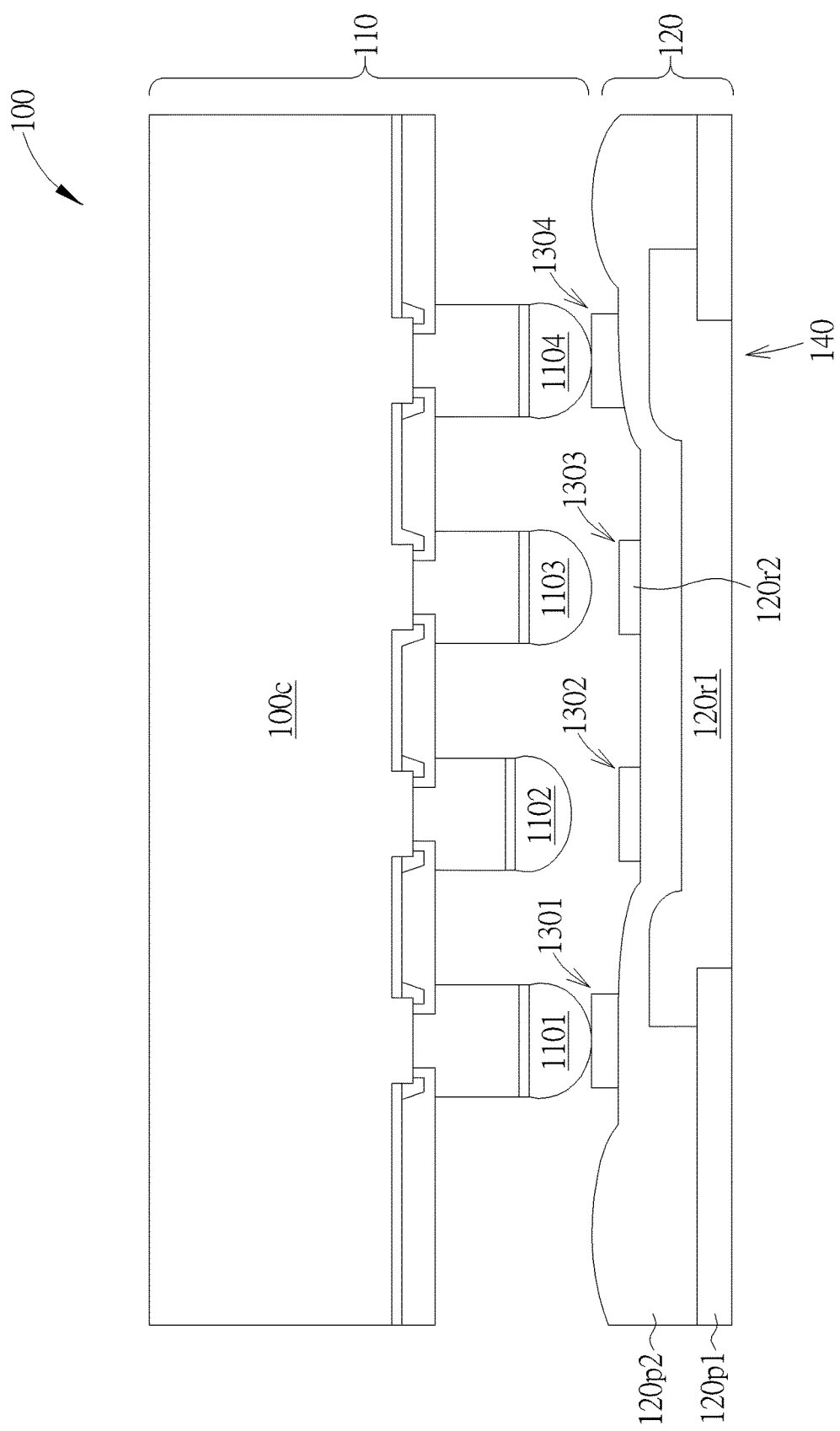
FIG. 1 illustrates a part of a package structure according to a prior art.
Figure 2:
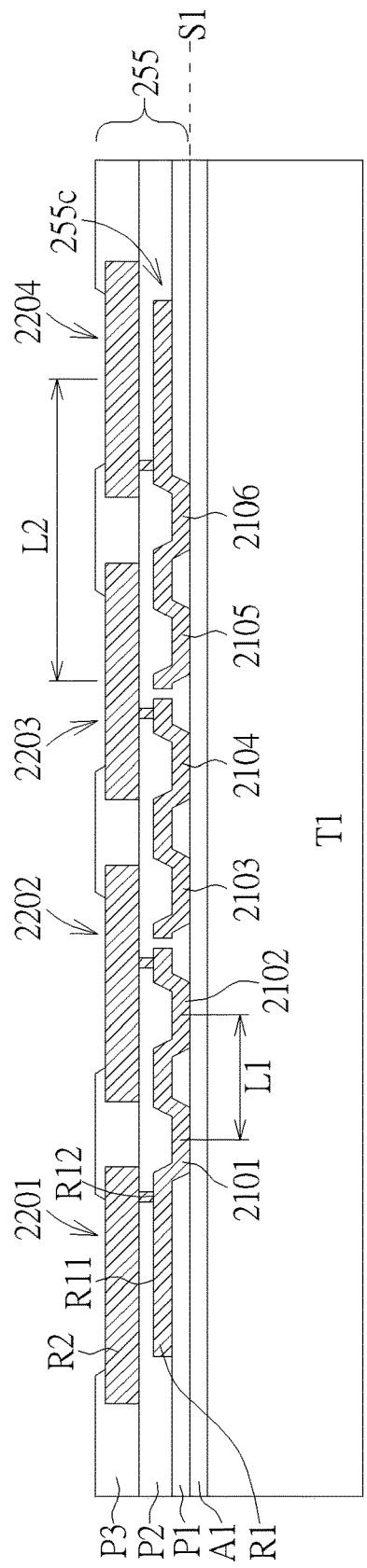
FIGS. 2-7 illustrate the process of forming a package structure according to an embodiment of the present invention.

In FIG. 2, a multi-layer structure 255 may be formed as described below. The first redistribution layer R1 and a first dielectric layer P1 may be formed on a temporary carrier T1 to generate a plurality of first conductive interfaces 2101-2106. The first conductive interfaces 2101-2106 may be disposed to be substantially coplanar on the temporary carrier T1. A distance between two neighboring first conductive interfaces 2101-2106 may be at least a first pitch L1. The number of the first conductive interfaces 2101-2106 is six in FIG. 2, and this is merely an example rather than limiting the scope of the present invention. According to an embodiment of the present invention, an release layer A1 may be formed between the temporary carrier T1 and a surface S1 formed by the first dielectric layer P1.

A second dielectric layer P2 may be formed over the first redistribution layer R1 and the first dielectric layer P1. When forming the second dielectric layer P2, a dielectric layer may be formed over the first redistribution layer R1 and the first dielectric layer P1 and the dielectric layer may be patterned by removing an unwanted portion of the dielectric layer. The second dielectric layer P2 may cover a first portion R11 of the first redistribution layer R1 and expose a second portion R12. The second portion R12 of the second redistribution layer R2 may be filled with conductive material used to electrically connect the first redistribution layer R1 to another redistribution layer (e.g. a second redistribution layer R2 in FIG. 2).

In the exemplary embodiment shown in FIG. 2, the multi-layer structure 255 may include three dielectric layers P1-P3 and two redistribution layers R1-R2. Hence, the second redistribution layer R2 may be a topmost redistribution layer, and the third dielectric layer P3 may be a topmost dielectric layer. However, according to another embodiment of the present invention, a multi-layer structure formed on the temporary carrier T1 may include more dielectric layers and redistribution layers. For example, a structure of four dielectric layers and three redistribution layers may be used to form a multi-layer structure.

In FIG. 2, a circuitry 255c may be formed by the first redistribution layer R1 and the second redistribution layer R2. The second redistribution layer R2 and the third dielectric layer P3 may generate a plurality of second conductive interfaces 2201-2204. A distance between two neighboring second conductive interfaces such as 2203 and 2204 may be at least a second pitch L2. The second pitch L2 may be larger than the first pitch L1. Similarly, the number of the conductive interfaces 2201-2204 is four in FIG. 2, and this number is merely used as an example.

As described above, the multi-layer structure 255 may include more dielectric layers and redistribution layers than what is shown in FIG. 2. For example, a fourth dielectric layer may be formed between the second dielectric layer P2 and the third dielectric layer P3. More dielectric layer may be achievable. A portion of the fourth dielectric layer may be removed to pattern the dielectric layer. A third redistribution layer may be formed between the second redistribution layer R2 and the first redistribution layer R1. More redistribution layer may be achievable. A portion of the third dielectric layer P3 may be removed to pattern the third dielectric layer P3. When the multi-layer structure 255 further includes the foresaid fourth dielectric layer and the foresaid third redistribution layer, the circuitry 255c may be formed by the first redistribution layer R1, the second redistribution layer R2 and the third redistribution layer between the first redistribution layer R1 and the second redistribution layer R2. Similarly, when the multi-layer structure 255 includes a fourth redistribution layer, the circuit 255c may be formed by the first to fourth redistribution layers, and so on.

Figure 3:
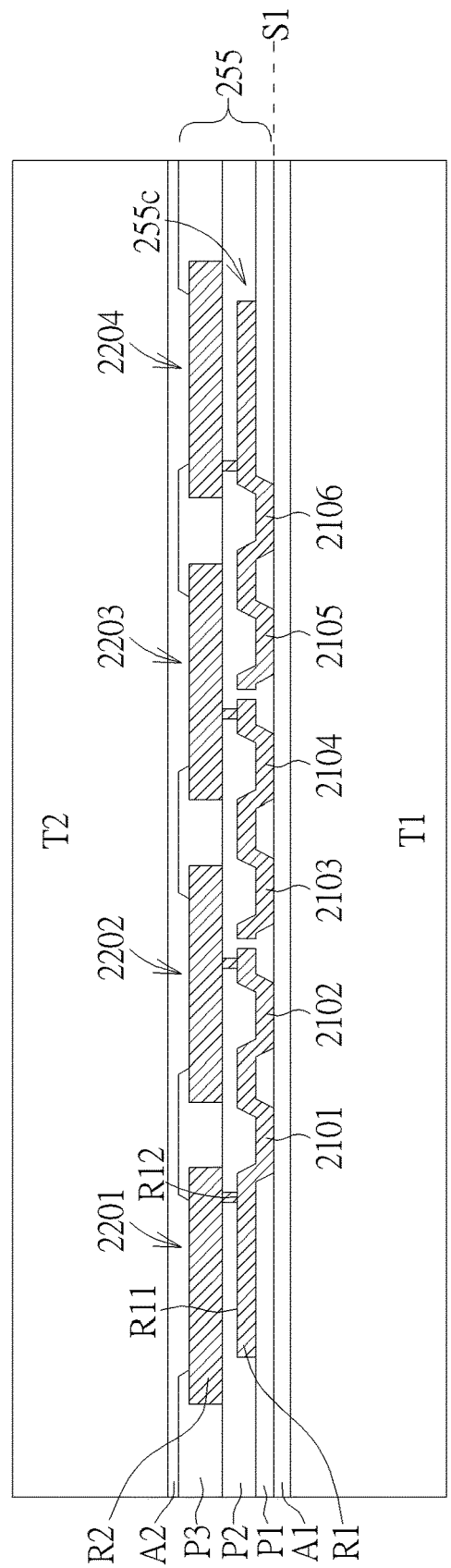

FIG. 3 illustrates that a temporary carrier T2 may be disposed onto the second redistribution layer R2 and the third dielectric layer P3 to support the multi-layer structure 255 when the temporary carrier T1 is de-bonded. An adhesive layer A2 may be formed between the temporary carrier T2, and the second redistribution layer R2 and the third dielectric layer P3. The adhesive layer A2 may be formed by forming a coat of adhesive material or using an attach film. As shown in FIG. 3, the second conductive interfaces 2201-2204 may be formed by patterning the dielectric layer P3 to expose a portion of the redistribution layer R2. By using a flexible adhesive layer A2, the stress between the temporary carrier T2 and the multi-layer structure 255 may be reduced.

Figure 4:
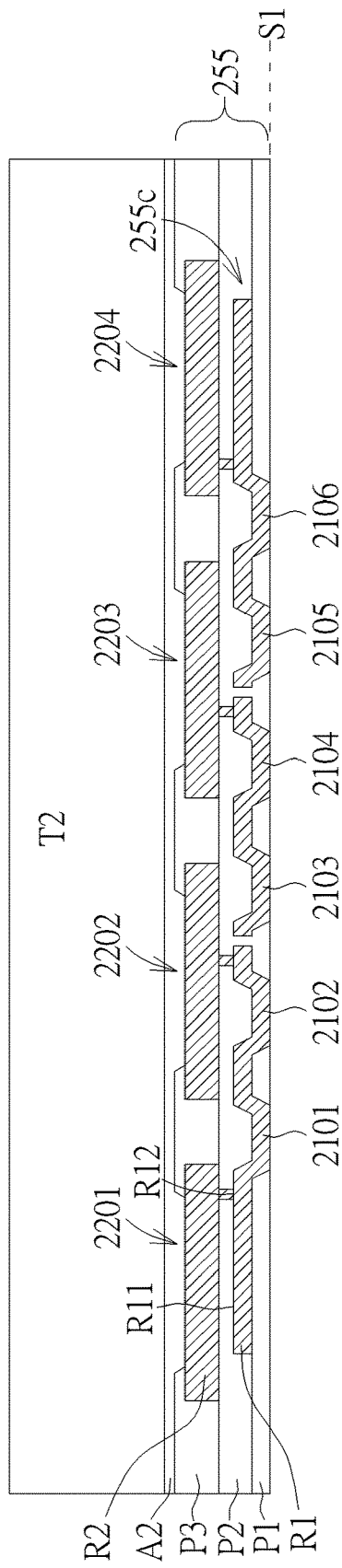

By disposing the multi-layer structure 255 on the temporary carrier T1, the surface S1 may be a planar surface. FIG. 4 illustrates that the temporary carrier T1 may be removed after the conductive interfaces 2101-2106 and the conductive interfaces 2201-2204 are formed. The removal of the temporary carrier T1 may be performed by exposing the release layer A1 with desirable light, heating and/or other suitable means.

Figure 5:
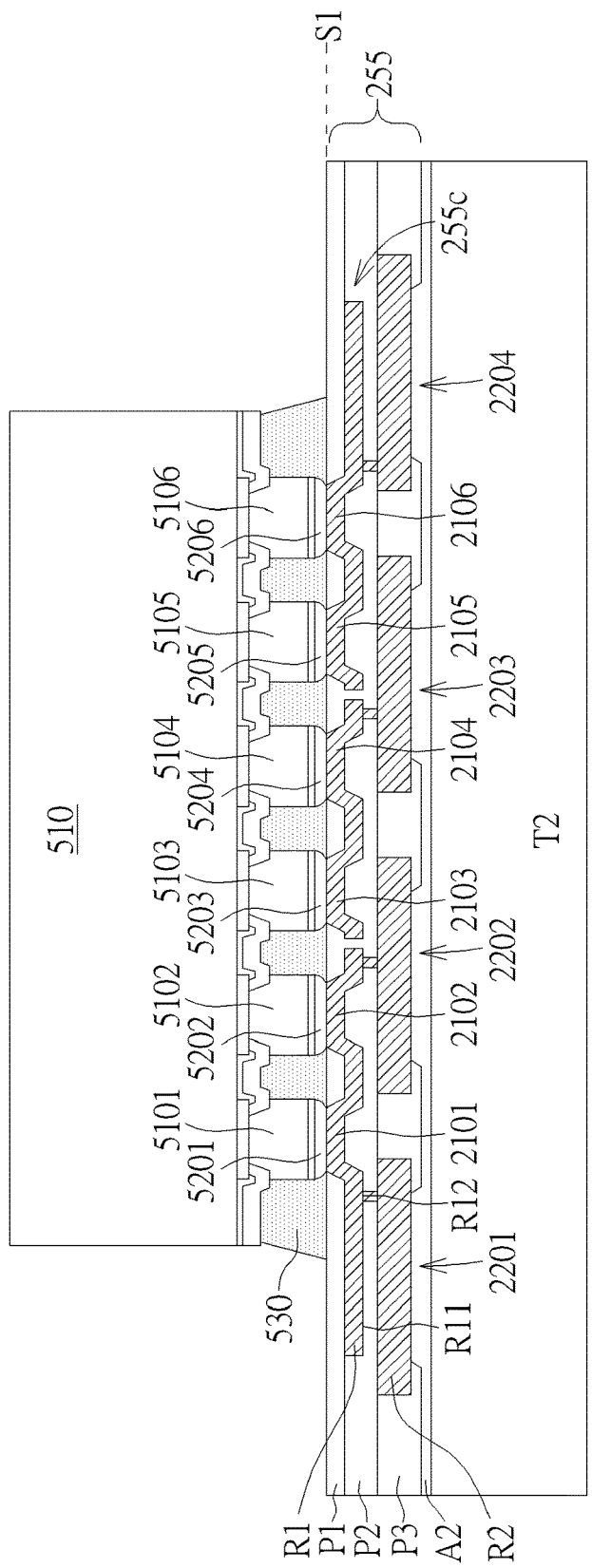

FIG. 5 illustrates that the multi-layer structure 255 may be flipped so as to set the conductive interfaces 2101-2106 on top, and a chip 510 may be electrically connected to the corresponding conductive interfaces 2101-2106. According to an embodiment of the present invention, a plurality of solders 5201-5206 may be disposed on the conductive interfaces 2101-2106, and then a plurality of conductive bumps 5101-5106 of the chip 510 may be disposed onto the solders 5201-5206. According to another embodiment, first sides of the solders 5201-5206 may disposed on the conductive bumps 5101-5106, and then second sides of the solders 5201-5206 may be disposed on the conductive interfaces 2101-2106. An underfill material may be filled around the solders 5201-5206 to form an underfill layer 530 to improve reliability.

Figure 6:
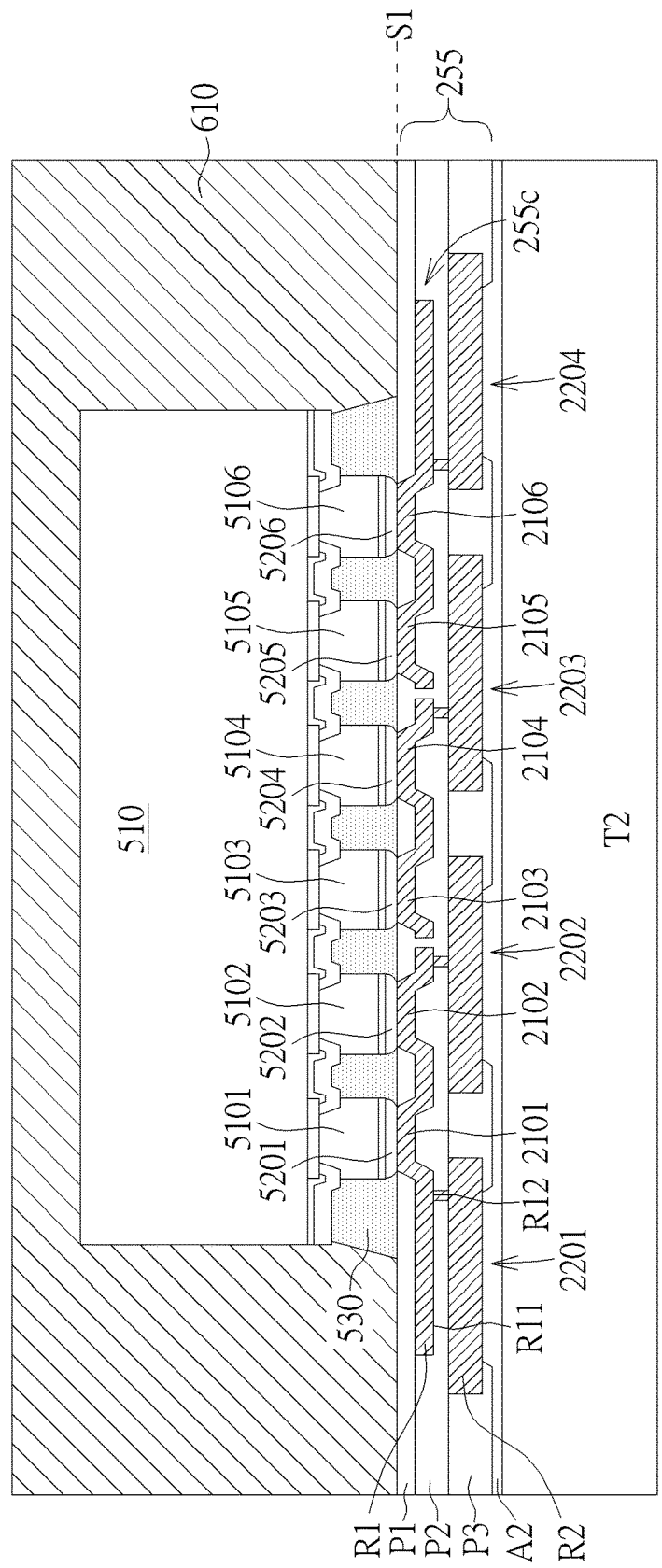
Figure 7:
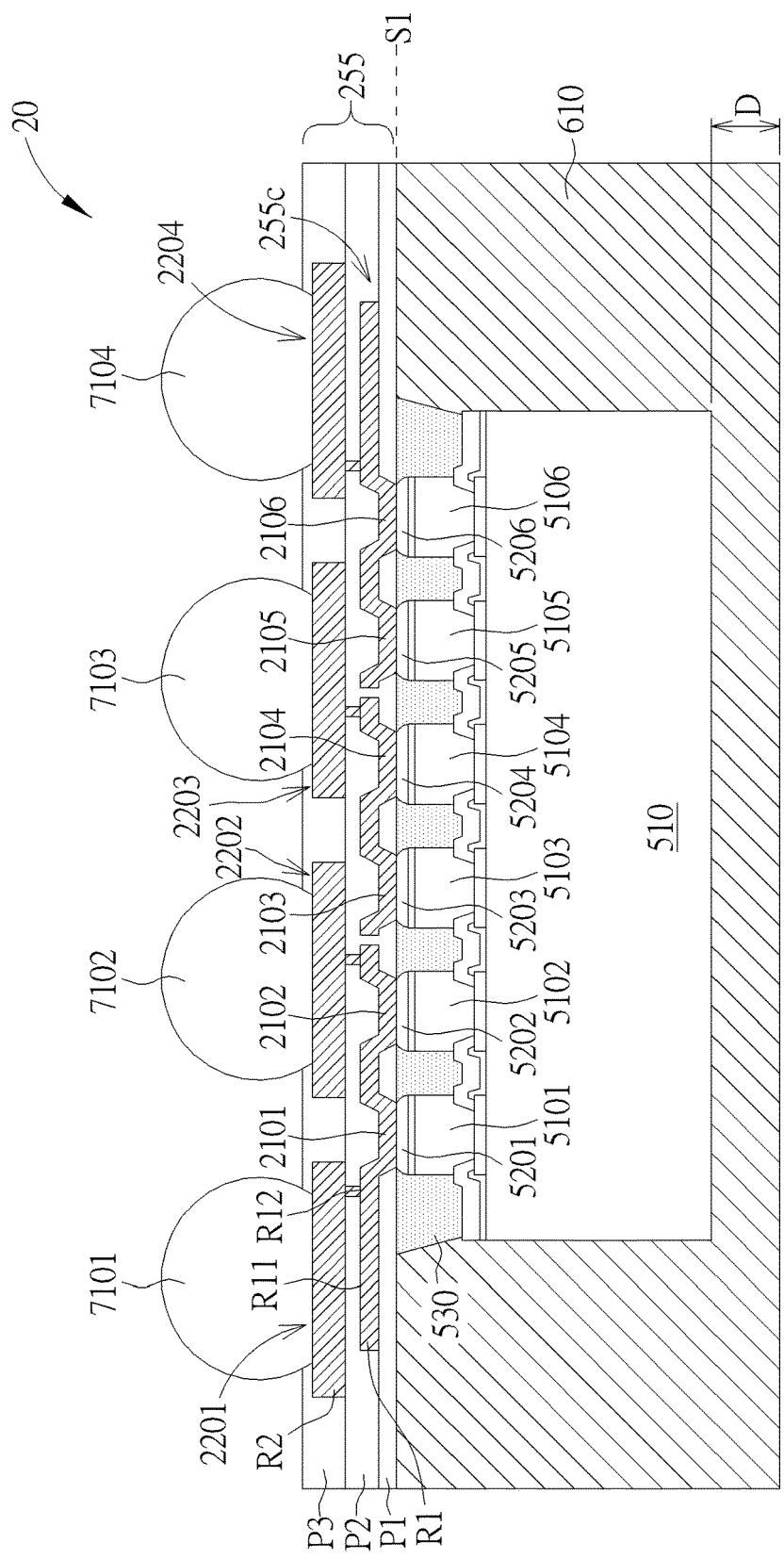

FIG. 6 illustrates that a mold material may be filled to form a mold layer 610. The mold layer 610 may encapsulate the chip 510. FIG. 7 illustrates that the temporary carrier T2 may be removed, and a plurality of solder balls 7101-7104 may be disposed on the conductive interfaces 2201-2204. Comparing with FIG. 6, in FIG. 7, the structure including the multi-layer structure 255 and the mold layer 610 may be flipped to set the conductive interfaces 2201-2204 on top for solder ball placement. According to an embodiment of the present invention, the mold layer 610 may be thinned to reduce a distance D from the chip 510 to a surface of the mold layer 610 for reducing the thickness of the package structure 20.

According to an embodiment, the conductive bumps 5101-5106 of FIG. 5 may be conductive pillar bumps such as copper pillar bumps. Regarding the bump structures formed with the conductive bumps 5101-5106 and the solders 5201-5206, in each bump structure, the thick portion may be copper (Cu) pillar, the medium portion may be nickel (Ni), and the spherical portion may be solder. The foresaid redistribution layers may be made of a conductive material such as copper formed by performing electroplating (e-plating). The foresaid dielectric layers (e.g. P1-P3) may be made of polyimide. Photo-sensitive dielectric materials may be used to form the dielectric layers for patterning the dielectric layers by applying light with a suitable wavelength, and developing process and curing process may be performed to fix the patterned dielectric layers.

According to embodiments of the present invention, the foresaid temporary carriers T1 and T2 may be formed by rigid materials such as glass, ceramic or silicon. As described above, the temporary carrier T2 close to the conductive interfaces 2201-2204 may be used optionally. Hence, according to an embodiment, when the temporary carrier T2 is not used, the step of removing the temporary carrier T2 may be omitted.

Figure 8:
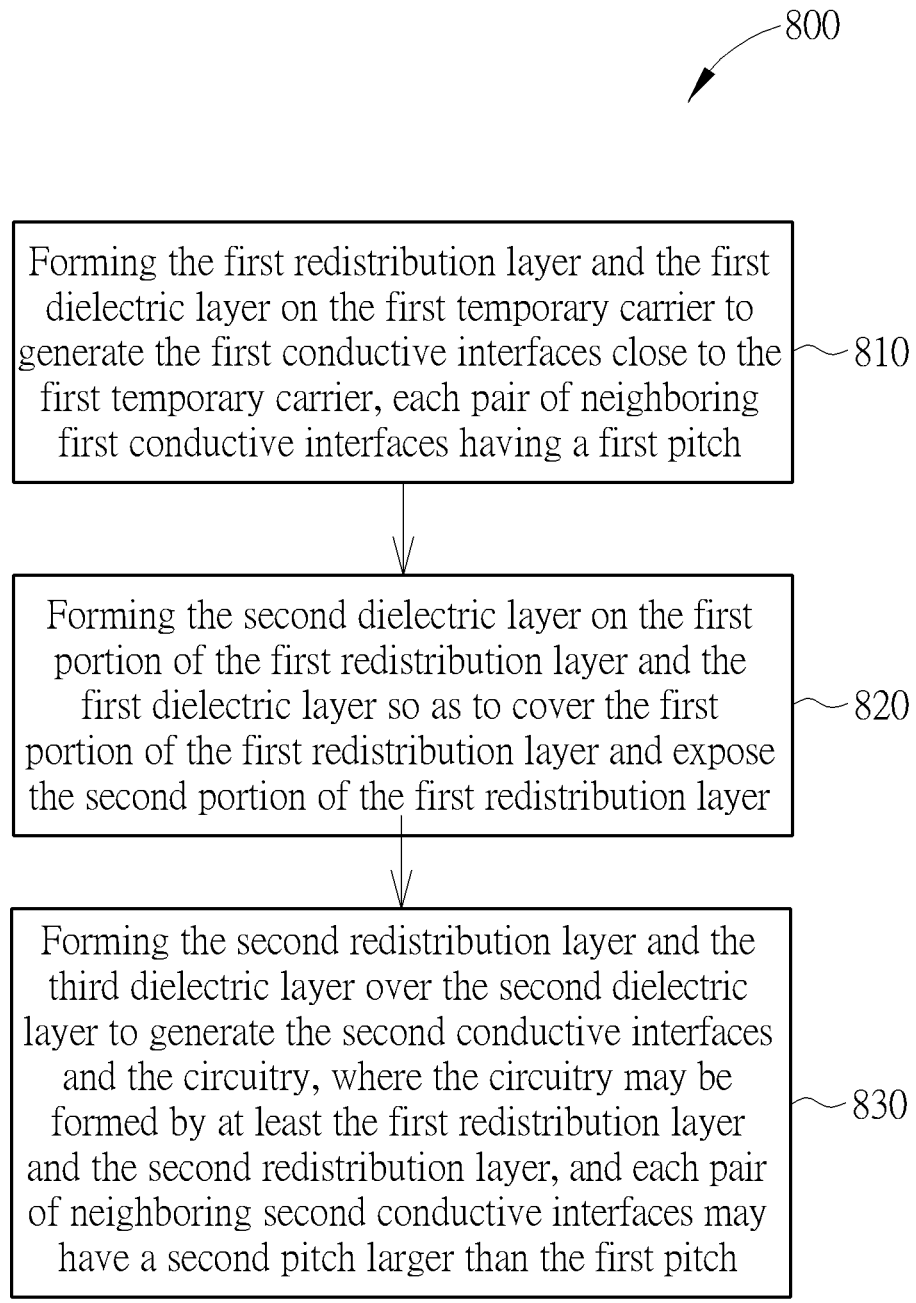
FIG. 8 illustrates the flowchart of a chip packaging method for generating the package structure according to an embodiment of the present invention.

FIG. 8 illustrates the flowchart of a chip packaging method 800 of generating the package structure 20 according to an embodiment of the present invention. FIG. 2 may correspond to the steps 810-830 of FIG. 8. The method 800 may include:

Step 810: forming the first redistribution layer R1 and the first dielectric layer P1 on the first temporary carrier T1 to generate the first conductive interfaces 2101-2106 close to the first temporary carrier T1, each pair of neighboring first conductive interfaces 2101-2106 having a first pitch L1;

Step 820: forming the second dielectric layer P2 on the first portion of the first redistribution layer R1 and the first dielectric layer P1 so as to cover the first portion R11 of the first redistribution layer R1 and expose the second portion R12 of the first redistribution layer R1; and Step 830: forming the second redistribution layer R2 and the third dielectric layer P3 over the second dielectric layer P2 to generate the second conductive interfaces 2201-2204 and the circuitry 255c, where the circuitry 255c may be formed by at least the first redistribution layer R1 and the second redistribution layer R2, and each pair of neighboring second conductive interfaces 2201-2204 may have a second pitch L2 larger than the first pitch L1.

Figure 9:
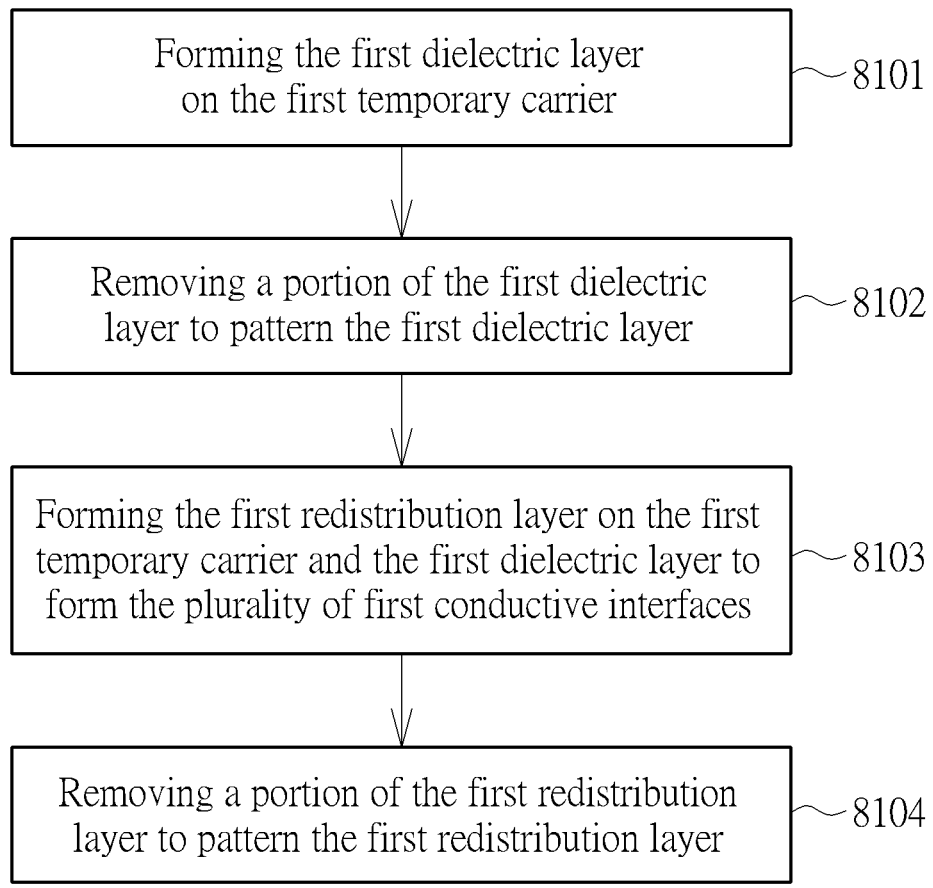
FIG. 9 illustrates details of a step of FIG. 8 according to an embodiment of the present invention.

Regarding Step 810, Step 810 may include following Step 8101-8104 according to an embodiment. FIG. 9 illustrates Steps 8101-8104 included by Step 810 of FIG. 8. Step 8101-8104 may be:

Step 8101: forming the first dielectric layer P1 on the first temporary carrier T1;

Step 8102: removing a portion of the first dielectric layer P1 to pattern the first dielectric layer P1;

Step 8103: forming the first redistribution layer R1 on the first temporary carrier T1 and the first dielectric layer P1 to form the plurality of first conductive interfaces 2101-2106; and Step 8104: removing a portion of the first redistribution layer R1 to pattern the first redistribution layer R1.

According to the embodiment of FIG. 9, the first dielectric layer P1 may be formed and patterned before forming and patterning the redistribution layer R1.

Figure 10:
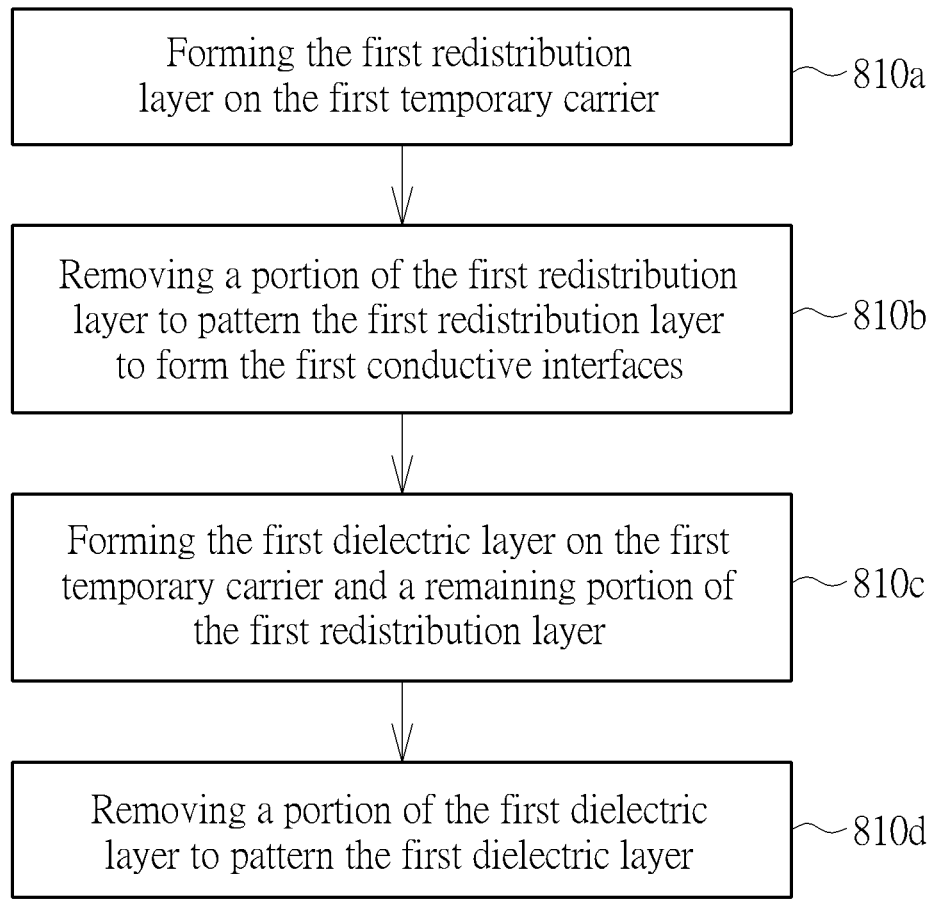
FIG. 10 illustrates details of a step of FIG. 8 according to another embodiment of the present invention.

Regarding Step 810, Step 810 may include following Step 810a-810d according to another embodiment. FIG. 10 illustrates Steps 810a-810d included by Step 810 of FIG. 8. Steps 810a-810d may be:

Step 810a: forming the first redistribution layer R1 on the first temporary carrier T1;

Step 810b: removing a portion of the first redistribution layer R1 to pattern the first redistribution layer R1 to form the first conductive interfaces 2101-2106;

Step 810c: forming the first dielectric layer P1 on the first temporary carrier T1 and a remaining portion of the first redistribution layer R1; and Step 810d: removing a portion of the first dielectric layer P1 to pattern the first dielectric layer P1.

According to the embodiment of FIG. 10, the first redistribution layer R1 may be formed and patterned before forming and patterning the first dielectric layer P1.

In summary, according to embodiments of the present invention, a flat surface S1 can be formed so that when bonding the chip 510 onto the multi-layer structure 255, all of the conductive interfaces 2101-2106 can be connected to the solders 5201-5206 of the chip 510, enhancing the yield of the package structure 20 and allowing a greater bonding process window.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip packaging method comprising:
    forming a first redistribution layer and a first dielectric layer on a first temporary carrier, the first dielectric layer having a first surface closest to the first temporary carrier, the first redistribution layer comprising a plurality of first conductive interfaces coplanar with the first surface, each pair of neighboring first conductive interfaces having a first pitch;
    forming a second dielectric layer on a first portion of the first redistribution layer and the first dielectric layer so as to cover the first portion of the first redistribution layer and expose a second portion;
    forming a second redistribution layer and a third dielectric layer over the second dielectric layer to generate a plurality of second conductive interfaces, a circuitry being formed by at least the first redistribution layer and the second redistribution layer and each pair of neighboring second conductive interfaces having a second pitch larger than the first pitch;
    placing a second temporary carrier onto the second redistribution layer and the third dielectric layer for supporting the first redistribution layer, the second redistribution layer, and the first dielectric layer to the third dielectric layer when the first temporary carrier is removed;
    removing the first temporary carrier;
    flipping a multi-layer structure having the first dielectric layer, the first redistribution layer, the second dielectric layer, the second redistribution layer and the third dielectric layer so as to set the plurality of first conductive interfaces on top;
    bonding a chip onto the plurality of first conductive interfaces;
    removing the second temporary carrier; and
    disposing a plurality of second solder balls onto the plurality of second conductive interfaces after the second temporary carrier is removed.

2. The method of claim 1, wherein forming the first redistribution layer and the first dielectric layer on the first temporary carrier comprises:
    forming the first dielectric layer on the first temporary carrier;
    removing a portion of the first dielectric layer to pattern the first dielectric layer;
    forming the first redistribution layer on the first temporary carrier and the first dielectric layer to form the plurality of first conductive interfaces; and
    removing a portion of the first redistribution layer to pattern the first redistribution layer.

3. The method of claim 1, wherein forming the first redistribution layer and the first dielectric layer on the first temporary carrier comprises:
    forming the first redistribution layer on the first temporary carrier;
    removing a portion of the first redistribution layer to pattern the first redistribution layer to form the plurality of first conductive interfaces;
    forming the first dielectric layer on the first temporary carrier and a remaining portion of the first redistribution layer; and
    removing a portion of the first dielectric layer to pattern the first dielectric layer.

4. The method of claim 1, further comprising:
    forming a fourth dielectric layer between the second dielectric layer and the third dielectric layer;
    removing a portion of the fourth dielectric layer to pattern the fourth dielectric layer;
    forming a third redistribution layer between the second redistribution layer and the first redistribution layer; and
    removing a portion of the third redistribution layer to pattern the third redistribution layer;
    wherein the circuitry is formed by at least the first redistribution layer, the second redistribution layer and the third redistribution layer.

5. The method of claim 1, wherein bonding the chip onto the plurality of first conductive interfaces comprises:
    disposing a plurality of first solders of the chip onto the plurality of first conductive interfaces;
    wherein each of the plurality of first solders is a portion of a conductive bump of the chip.

6. The method of claim 5, wherein bonding the chip onto the plurality of first conductive interfaces further comprises:

filling an underfill material around the conductive bump of the chip to form an underfill layer.

7. The method of claim 1, further comprising:
filling a mold material to form a mold layer encapsulating the chip.

8. The method of claim 7, further comprising:
thinning the mold layer to reduce a distance from the chip to a surface of the mold layer.

9. The method of claim 1, wherein the second temporary carrier is formed by glass.

10. The method of claim 1, further comprising:
filling an adhesive material between the second conductive interfaces and the second temporary carrier.

11. The method of claim 1, further comprising:
filling a release layer between the first conductive interfaces and the first temporary carrier.

12. The method of claim 1, wherein the first temporary carrier is formed by glass.

13. The method of claim 1, wherein the first conductive interfaces are disposed substantially coplanar on the temporary carrier.

* * * * *